(12) United States Patent
Cyrille et al.

(10) Patent No.: US 7,329,362 B2
(45) Date of Patent: Feb. 12, 2008

(54) DUAL ANGLE MILLING FOR CURRENT PERPENDICULAR TO PLANE (CPP) MAGNETORESISTIVE SENSOR DEFINITION

(75) Inventors: Marie-Claire Cyrille, San Jose, CA (US); Ying Hong, Morgan Hill, CA (US); Wipul Pemsiri Jayasekara, Los Gatos, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 238 days.

(21) Appl. No.: 11/200,757

(22) Filed: Aug. 9, 2005

(65) Prior Publication Data

US 2005/0269288 A1 Dec. 8, 2005

Related U.S. Application Data

(63) Continuation-in-part of application No. 10/652,053, filed on Aug. 29, 2003.

(51) Int. Cl.
*B44C 1/22* (2006.01)
(52) U.S. Cl. ....................................... 216/22
(58) Field of Classification Search .................. 216/22, 216/47, 94
See application file for complete search history.

(56) References Cited

U.S. PATENT DOCUMENTS

| | | | |
|---|---|---|---|
| 6,329,211 B1 * | 12/2001 | Terunuma et al. | 438/3 |
| 6,519,124 B1 | 2/2003 | Redon et al. | 360/324.2 |
| 6,712,984 B2 | 3/2004 | Sasaki | 216/22 |
| 6,723,252 B1 * | 4/2004 | Hsiao et al. | 216/22 |
| 6,729,015 B2 | 5/2004 | Matono et al. | 29/603.18 |
| 6,821,715 B2 | 11/2004 | Fontana, Jr. et al. | 430/320 |
| 6,822,837 B2 | 11/2004 | Kasahara et al. | 360/324.2 |
| 2002/0076940 A1 | 6/2002 | Hibino | 438/768 |
| 2003/0143431 A1 | 7/2003 | Hasegawa | 428/692 |
| 2004/0114284 A1 | 6/2004 | Rachid et al. | 360/324.11 |
| 2004/0136231 A1 | 7/2004 | Huai et al. | 365/158 |

OTHER PUBLICATIONS

Office Action Summary from U.S. Appl. No. 10/652,053 mailed on Jun. 4, 2007.

* cited by examiner

*Primary Examiner*—Roberts Culbert
(74) *Attorney, Agent, or Firm*—Zilka-Kotab, PC

(57) ABSTRACT

A method for constructing a magnetoresistive sensor which eliminates all redeposited material (redep) from the sides of the sensor. The method involves forming a mask over a plurality of sensor layers, and then performing an ion mill at an angle that is nearly normal to the surface of the sensor layers. A second (glancing) ion mill is then performed at a larger angle with respect to the normal. The first ion mill may be 0-30 degrees with respect to normal, whereas the second ion mill can be 50-89 degrees with respect to normal. The first ion mill is performed with a larger bias voltage than the second ion mill. The higher bias voltage of the first ion mill provides a well collimated ion beam to form straight vertical side walls. The lower bias voltage of the second ion mill prevent damage to the sensor layers during the removal of redep from the sides of the sensor.

23 Claims, 8 Drawing Sheets

DUAL ANGLE MILLING FOR CURRENT PERPENDICULAR TO PLANE (CPP) MAGNETORESISTIVE SENSOR DEFINITION

This application is a Continuation In Part of U.S. patent application Ser. No. 10/652,053, Publication Number US2005-0045580A1, Filed Aug. 29, 2003, entitled METHOD OF FABRICATING ELECTRONIC COMPONENT USING RESIST STRUCTURE WITH NO UNDERCUT, which is incorporated herein by reference in its entirety.

FIELD OF THE INVENTION

The present invention relates to magnetoresistive sensors and more particularly to the fabrication of a current perpendicular to plane (CPP) magnetoresistive sensor.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer. With the ever increasing demand for improved data rate and data capacity, engineers and scientists have been under constant pressure to develop ever smaller magnetoresistive sensors. The various dimensions of a sensor scale together, so as the track width of a sensor decreases, the gap thickness and stripe height decrease accordingly.

With the drive for ever increased data rate and data density, researchers have focused their efforts on the development of current perpendicular to plane (CPP) magnetoresistive sensors such as CPP GMR sensors and tunnel valves. Such sensors, especially tunnel valves, have the potential to provide greatly increased sensor performance such as increased dR/R, decreased gap thickness (ie. bit length), and may provide an improved ability to read signals from high coercivity media such as those used in perpendicular recording systems. Perpendicular recording systems are viewed as the future of magnetic recording, because of their ability to record much smaller bits of data than is possible using more traditional longitudinal recording systems.

CPP GMR sensors operate based on spin dependent scattering of electrons, similar to that a more traditional current in plane (CIP) sensor. However, in a CPP sensor, current flows from the top to the bottom of the sensor in a direction perpendicular to the plane of the sensor. A tunnel valve, or tunnel junction sensor operates based on the spin dependent tunneling of electrons through a very thin, non-magnetic, electrically insulating barrier layer. A challenge that has prevented the commercialization of CPP GMR sensors, and tunnel valves, has been the shunting of current across the sensor. This is especially problematic for tunnel valves which rely on the high resistance of the barrier layer.

A method that has been used to construct sensors involves depositing the sensor layers (ie. pinned layer spacer/barrier layer, free layer) as full film layers, and then forming a mask structure over the layers. The mask structure may include a non-photoreactive layer such as DURAMIDE®, and a photoresist layer formed over the DURAMIDE. The photoresist layer is then patterned to have a width to define the sensor track width and stripe height (back edge). If a non-photoreactive intermediary layer is present, the pattern from the photoreactive layer has to be transferred to this non-photoreactive layer using a method such as reactive ion etching. With the mask in place a material removal process is performed to remove sensor material not covered by the mask. Usually two separate masking and milling processes are performed, one to define the stripe height and another to define the track width.

As a bi-product of the milling operation, material that has been removed during milling becomes re-deposited on the sides and back of the sensor. This re-deposited material has been referred to in the industry as "redep". Such redep is undesirable in a CIP sensor because it increases parasitic resistance at the sides of the sensor and degrades free layer biasing. However, this redep is absolutely catastrophic in a CPP sensor such as CPP GMR or a tunnel valve, because it allows sense current to be shunted through the redep, completely bypassing the active area of the sensor.

Therefore, there is a strong felt need for a method for manufacturing a magnetoresistive sensor that can eliminate all redep from the sides of a CPP magnetoresistive sensor. Such a method would preferably not involve significant additional manufacturing cost or complexity and would not negatively affect the sensor layers.

SUMMARY OF THE INVENTION

The present invention provides a method of manufacturing a magnetoresistive sensor which eliminates all re-deposited material (redep) from the sides of the sensor. The method includes depositing sensor layers on a substrate, and then forming a mask over the substrate. A first ion mill is then performed to remove sensor material, thereby defining the sides or stripe height of the sensor. A second ion mill is then performed at a glancing angle with respect to the sensor layers to remove redep from the side of the sensor that may have formed during the first ion mill. The second ion mill is performed with a lower bias voltage than the first ion mill so as to prevent damage to the sensor layers during manufacture.

The first ion mill can be performed at an angle of 0-30 degrees with respect to a normal to the surface of the senor. The second ion mill can then be performed at an angle of 50-89 degrees with respect to the normal, so as to remove the redep.

The first ion mill can be performed with a bias voltage of 200-400 volts. This relatively larger bias voltage provides the ion beam collimation necessary to form straight vertical side walls. The second ion mill can then be performed with a bias voltage of 100-200 volts. This lower bias voltage prevents damage to the sensor layers during removal of the redep. Such damage that might occur using a higher bias voltage could include implantation of ions and atoms, and interdiffusion of the sensor layers.

The method of the present invention is particularly useful in manufacturing current perpendicular to plane (CPP) sensors such as CPP GMR sensors and tunnel valves because it avoids the shunting of current at the sides of the sensor. By eliminating all of the redep from the sides of the sensor while also preventing damage to the sensor layers at the sides of the sensor, the present invention provides a means of manufacturing a CPP sensor having improved magnetic performance and also improves sensor yield (ie. the number of useable sensor that can be produced on a wafer).

Although the present invention is described as being used to construct a magnetoresistive sensor, the invention applies to the construction any number of different electronic devices, such as semiconductor devices manufactured on a wafer such as a Si wafer.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
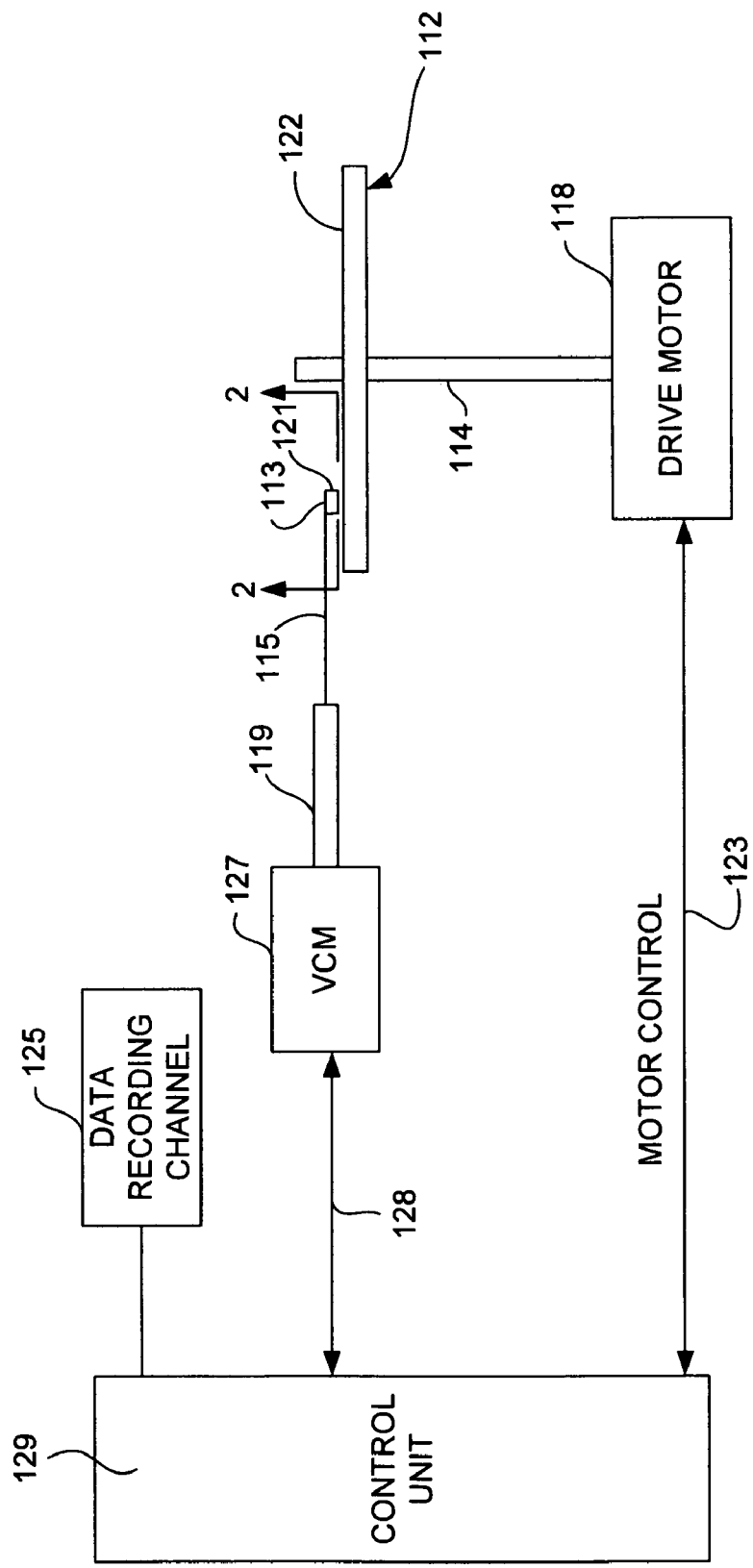
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
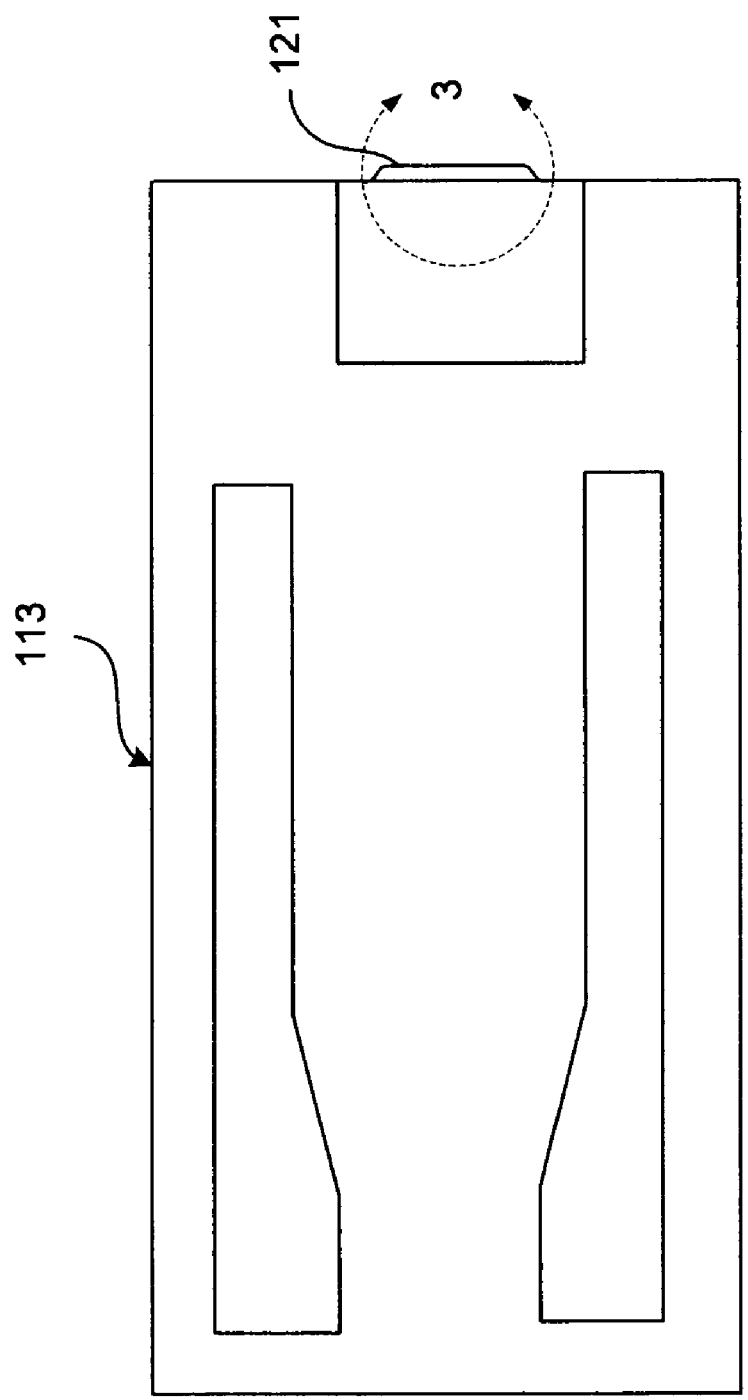
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
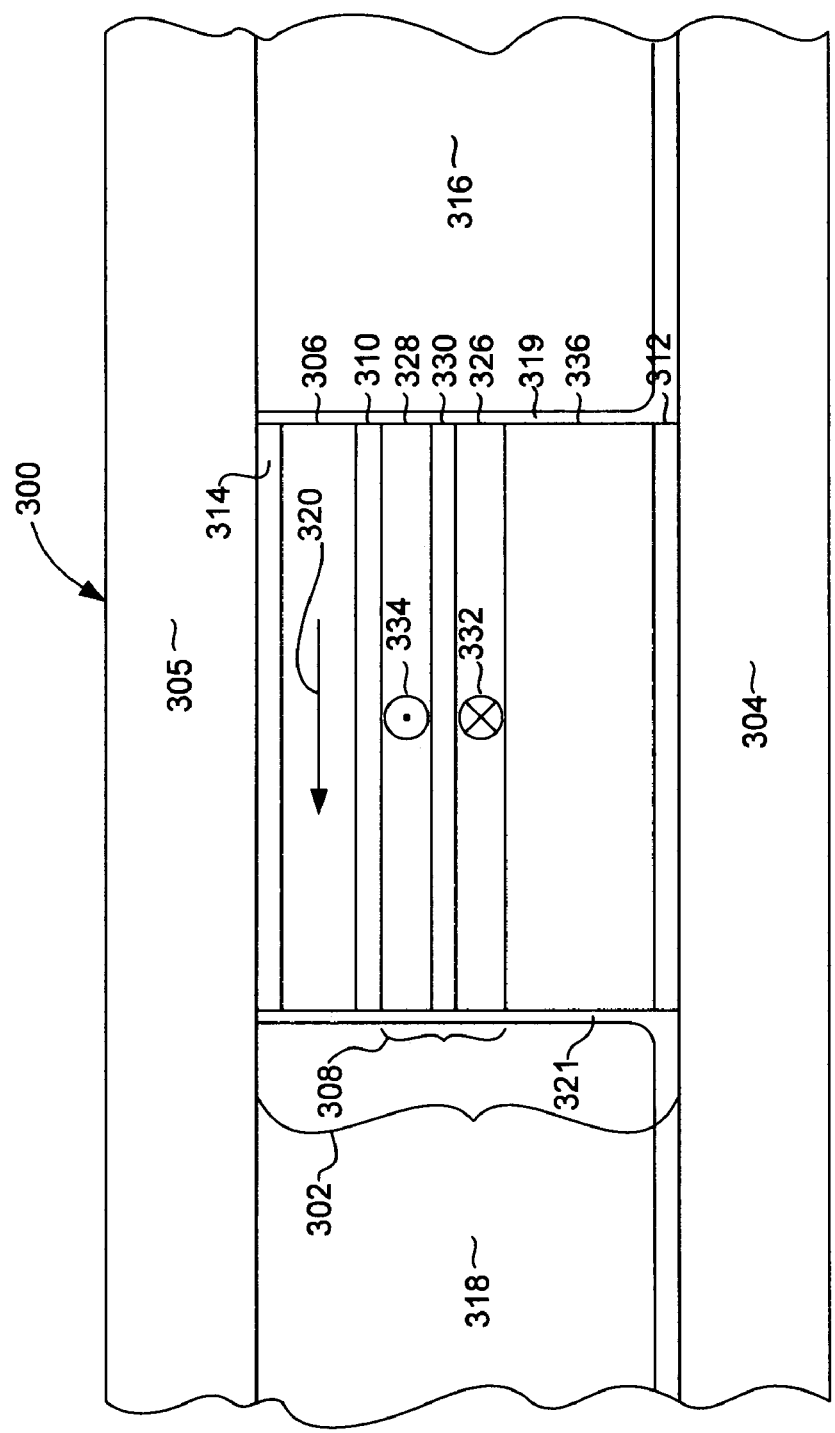
FIG. 3 is an enlarged ABS view taken from circle 3 of FIG. 2 and rotated 90 degrees counterclockwise.

With reference now to FIG. 3, a CPP magnetoresistive sensor 300 includes a sensor stack 302. The sensor 300 will be described in terms of a tunnel valve, but could also be embodied in a CPP GMR sensor or any other CPP sensor developed currently or in the future. The sensor stack 302 is sandwiched between first and second electrically conductive, magnetic shields 304, 305, which serve as both electrical leads and magnetic shields. The shields 304, 305 can be constructed of, for example, NiFe.

The sensor stack 302 includes a magnetic free layer 306, and a pinned layer structure 308. The free and pinned layers 306, 308 are separated from one another by a thin non-magnetic, electrically insulating barrier layer 310. The barrier layer can be constructed of, for example, alumina. Of course, as mentioned above, the invention could be embodied in a CPP GMR sensor, in which case the layer 310 would be an electrically conducive, non-magnetic spacer layer, such as Cu. A seed layer 312 may be provided at the bottom of the sensor to promote a desired grain growth in the sensor layers deposited thereon. In addition, a capping layer 314, such as Ta may be provided at the top of the sensor stack 302 to protect the sensor from damage, such as by corrosion, during manufacture.

With continued reference to FIG. 3, the pinned layer structure can be of several pinned layer designs, and is preferably an antiparallel coupled AFM pinned design. Therefore, the pinned layer structure 308 includes a first magnetic layer AP1 326, a second magnetic layer AP2 328 and an AP coupling layer 330 such as Ru sandwiched between the AP1 and AP2 layers 326, 328. The AP1 layer 326 is exchange coupled with a layer of antiferromagnetic material (AFM layer) 336, which strongly pins the magnetic moment 332 of the AP1 layer 326 in a desired direction perpendicular to the ABS. The antiparallel coupling between the AP1 and AP2 layers 326, 328 pins the magnetic moment 334 of the AP2 layer 328 in a direction antiparallel to the moment 332 of the AP1 layer 326. The AP1 and AP2 layers 326, 328 can be constructed of several magnetic materials and is preferably constructed of a material such as CoFe, which has a negative magnetostriction that aids pinning.

With reference still to FIG. 3, first and second hard bias layers 316, 318 are provided at either side of the sensor stack 302. The hard bias layers are separated from the sensor stack by insulation layers 319, 321. The insulation layers 319, 321 cover the sides of the sensor stack 302, and also extend over at least one of the shields 304, to prevent sense current from being shunted through the hard bias layer. The hard bias layers can be constructed of, for example CoPt or CoPtCr, and the insulation layers 319, 321 can be constructed of, for example alumina.

The hard bias layers 316, 318 provide a bias field, which is magnetostatically coupled with the free layer to bias the magnetic moment 320 of the free layer in a desired direction parallel with the ABS, while leaving it free to rotate response to a magnetic field from a magnetic medium. The free layer can be constructed of several magnetic materials, and is preferably constructed of Co, CoFe, NiFe or a combination of these materials.

Figure 4:
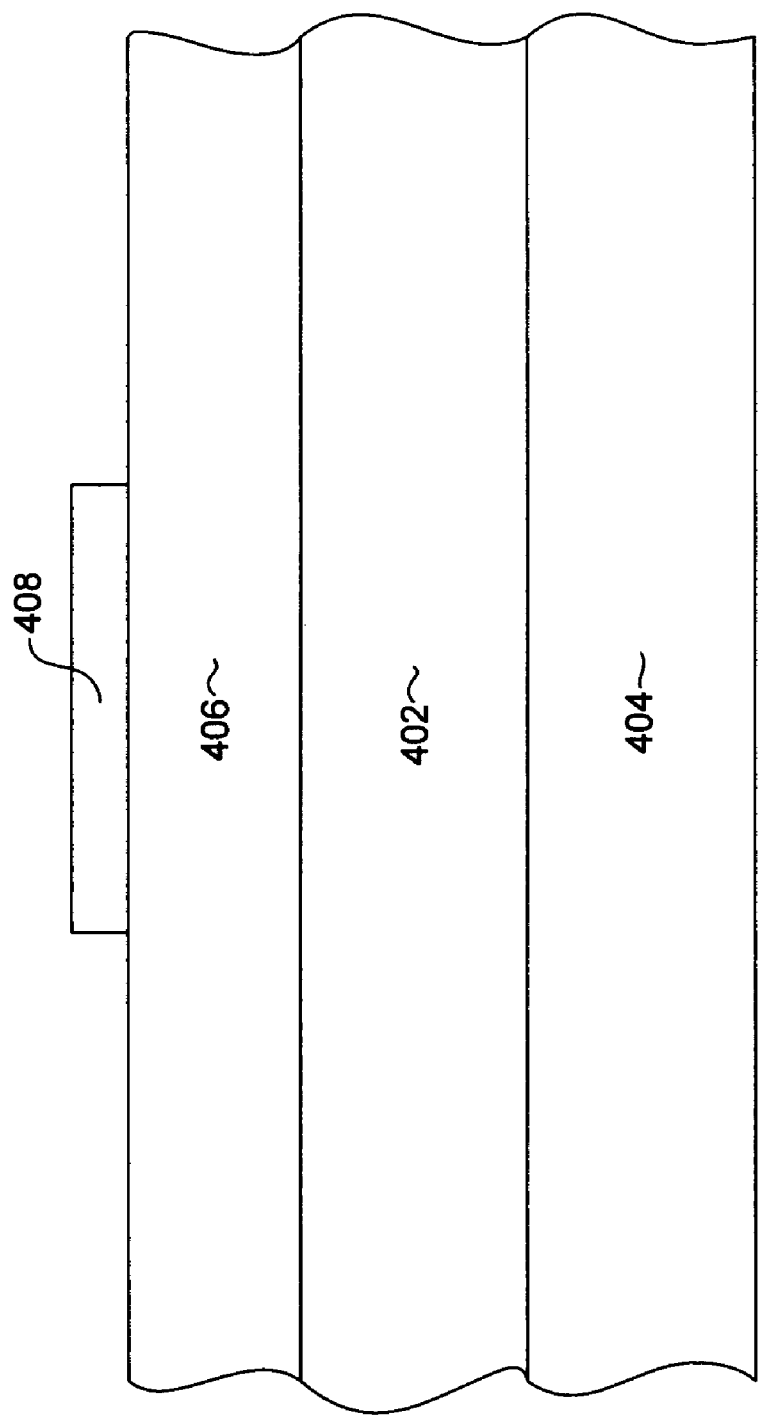
FIGS. 4-8 are views of a magnetoresistive sensor in various intermediate stages of manufacture, illustrating a method of manufacturing a sensor according to an embodiment the invention.

With reference now to FIGS. 4-8, a method for constructing a sensor 300 according to an embodiment of the invention is described. With particular reference to FIG. 4, a plurality of sensor layers 402 are deposited full film onto a substrate 404, such as a magnetic, electrically conducting shield layer. Although shown as a single layer in FIG. 4, the sensor layers 402 should be understood to include the sensor layers described above, such as the AFM layer 336, pinned layer 308, spacer layer 330 and free layer 306. An image transfer layer 406 such as DURAMIDE may be applied over the sensor layers 402, and a photoresist mask 408 is formed over the image transfer layer 406.

Figure 5:
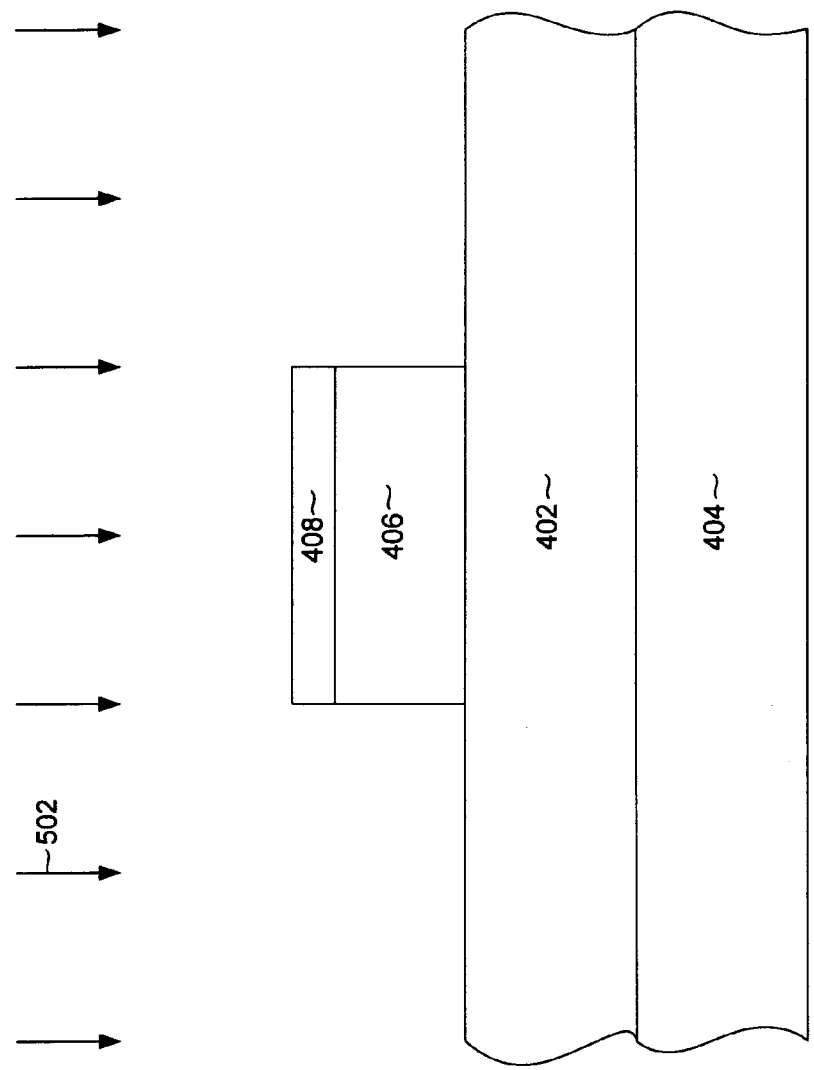

With reference now to FIG. 5, a reactive ion etch (RIE) 502 is performed to transfer the image of the photoresist mask 408 onto the underlying image transfer layer 406. Although the mask structure that is created by layers 406, 408 actually includes multiple material layers, it may be described as a single layer mask structure, as distinguished from the more common bi-layer mask structures, which have intentionally formed undercuts (i.e. the have overhanging portions). These undercuts or overhanging portions are intentionally formed to facilitate lift off of the mask structure after the mask is no longer needed. However, we have found that the use of such bi-layer mask structures, prevent the manufacture of straight sharp side walls on the sensor. The ion milling process described herein eliminates the need for such a bi-layer mask structure and therefore provides for the formation of a sensor having straight vertical side walls as desired.

Figure 6:
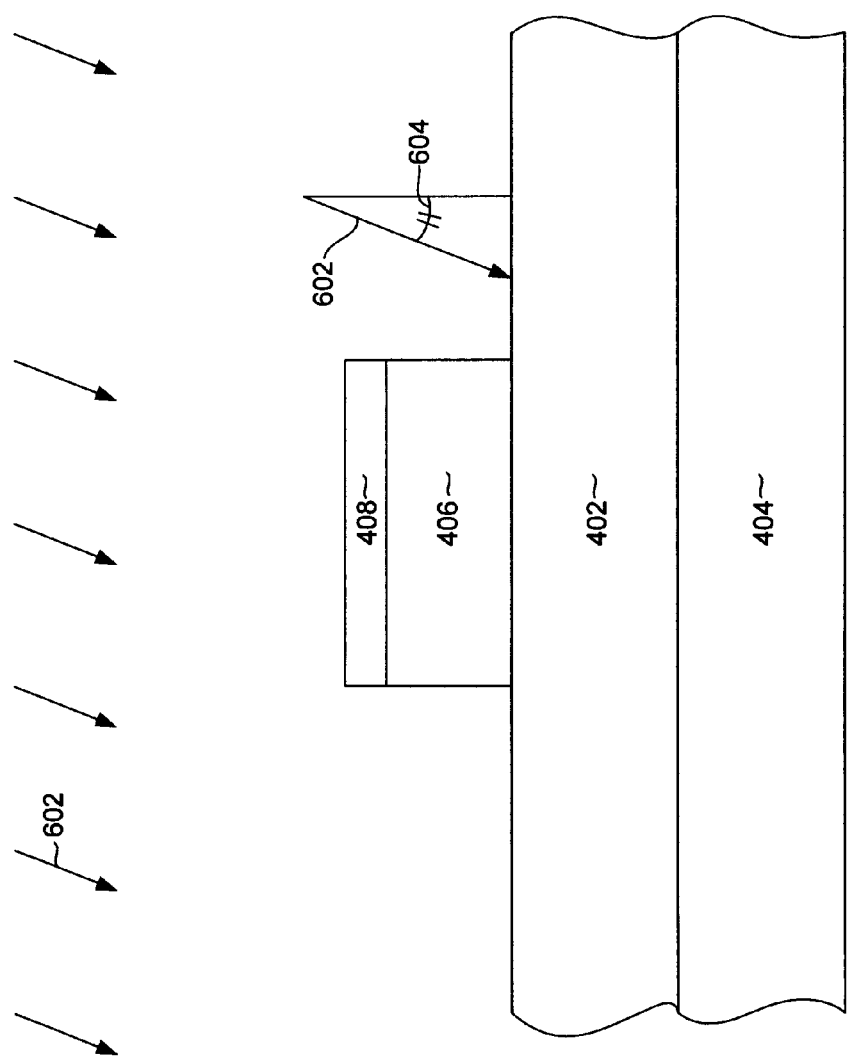

With reference to FIG. 6, a first ion mill 602 is performed to remove sensor material not covered by the mask structure 404, 406. This first ion mill 602 is formed at an angle 604 of 0 to 30 degrees with respect to a normal to the surface of the layers 402. The first ion mill 602 is performed at a relatively high bias voltage of about 200-400V. The ion mill is performed while rotating the chuck (not shown) on which the layers 404, 402, 406, 408 are held on a wafer (also not shown). The rotation of the chuck ensures that the ion mill 602 will be performed evenly and uniformly.

With continued reference to FIG. 4, the substrate 404 can be an electrically conductive lead material and can be an electrically conductive, magnetic material such as NiFe. In other words, the substrate 404 can be the material that makes up the first lead/shield 304 described in FIG. 3. It should be pointed out that although the first ion mill 602 has been illustrated as completely removing sensor material down to the level of the substrate 404, this is for purposes of illustration only. There are many circumstances where it may be desired that only a portion of the sensor material be removed. Such sensor designs are referred to as "partial mill" designs. For example, in some instances the free layer 306, barrier/spacer layer 310, and pinned layer 308 may be removed while leaving all or a portion of the AFM layer 336 extending from the sides of the sensor. In other circumstances, it may be desired to leave all or a portion of the pinned layer structure 308 extending from the sides of the sensor (ie. milling 602 stops short of removing any or a portion of the pinned layer 308).

Figure 7:
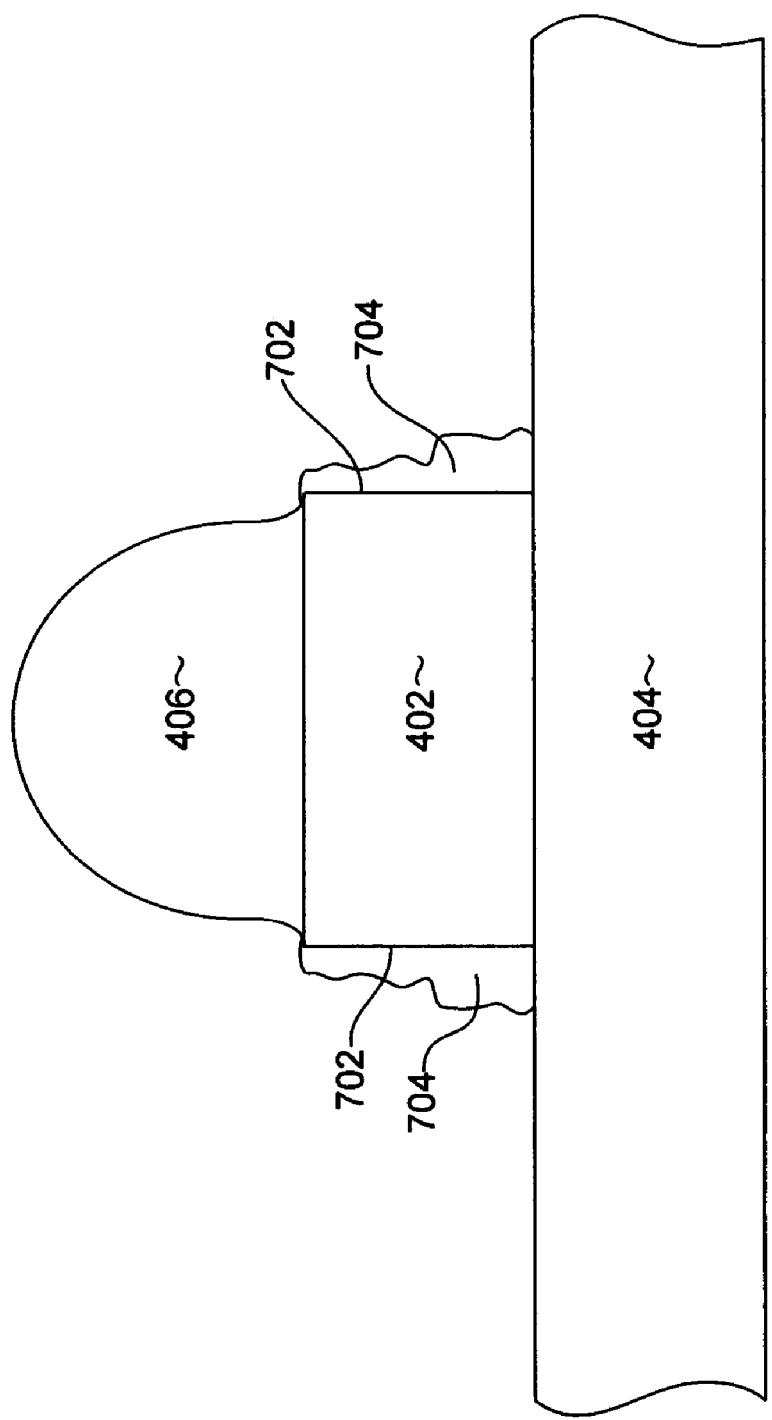

With reference to FIG. 7, this first ion mill 602 results in a defined sensor having substantially vertical side walls 702 and a significant amount of re-deposited material (redep) 704 on the sides 702. The higher bias voltage (as compared to a later ion mill to be described herein below) of the first ion mill 602 is necessary to provide a sufficient collimation of the ion beam to provide the directionality needed to form desired substantially straight vertical side walls.

Figure 8:
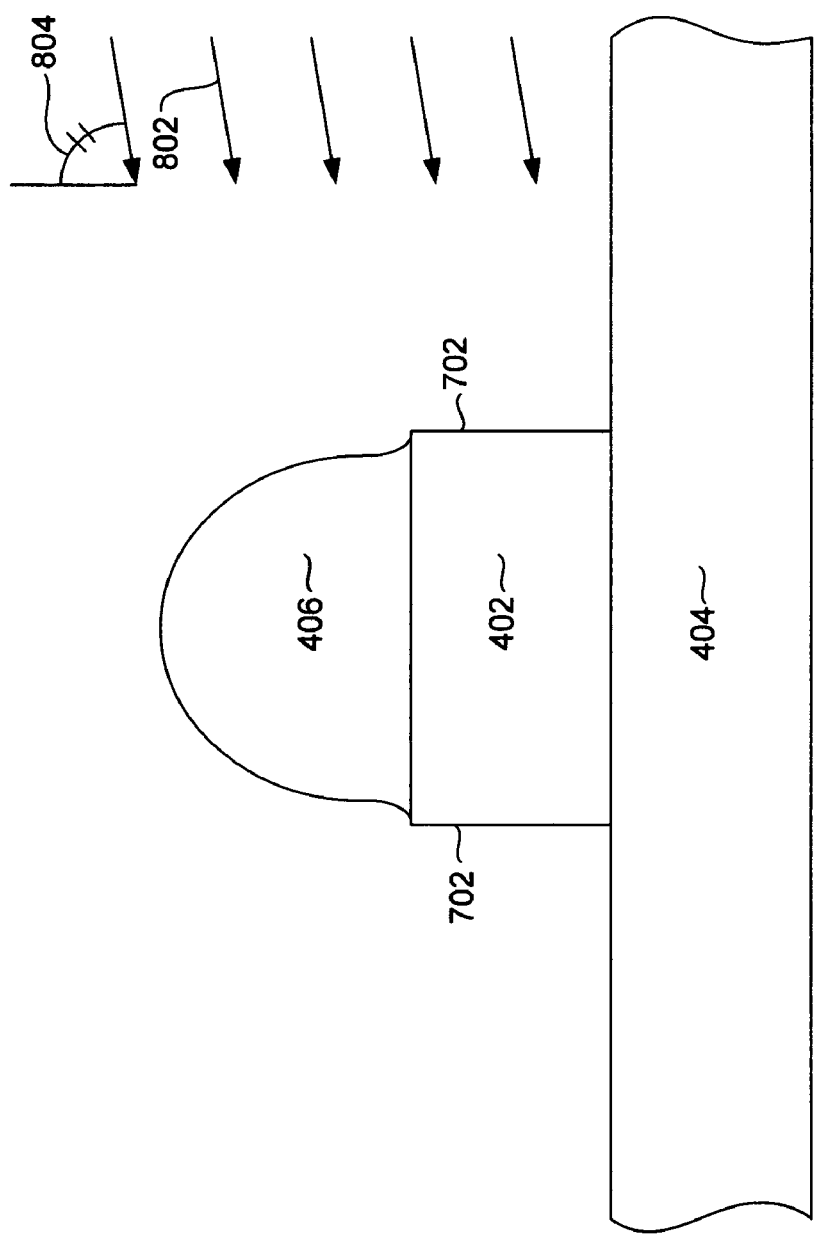

With reference now to FIG. 8, a second ion mill 802 is performed at an angle 804 of 50-89 degrees. This second (glancing) ion mill 802 is preferably performed for an amount of time that is about 100% to 200% of the time that the first ion mill is performed. In addition, this second ion mill is performed at a lower bias voltage than the first ion mill 602. The second ion mill is preferably performed with a bias voltage of 100V to 200V as compared with 200V to 400V for the first ion mill 602. The second, glancing ion mill effectively removes all of the redep 704 from the sides 702 of the sensor, eliminating any chance that sense current will be shunted through the sides of the sensor in the finished magnetoresistive sensor. Of course, this second ion mill 702 is performed while rotating the chuck on which the layers 402, 404, 406 are held, in order to ensure an even, uniform removal of the redep 704 from the sensor. It should be pointed out that although this process is being described in terms of a track width definition process, this process also applies to the formation of the stripe height, and to the removal of redep from the stripe height edge of the sensor. This process is not necessarily limited to a single sharp angle mill step followed by a single shallow angle mill step, but could have many sharp angle mill steps, each followed by a shallow angle step to clean the redeposited material.

The use of a lower bias voltage during the second ion mill 802 reduces damage to the sensor layers. A higher bias voltage, such as that used during the first ion mill 602, would cause implantation of the removed atoms into the sides 702 of the sensor. This implantation would destroy the magnetic properties of the materials making up the sensor. Such implantation of atoms into the sides 702 of the sensor 402 would also cause diffusion of the sensor material among the various sensor layers, seriously diminishing sensor performance.

The above described invention has been described as being employed to construct a magnetoresistive sensor. However, it should be understood that the method described above can be used to construct any number of electronic devices such as semiconductor devices. For example, the sensor layers could be layers of any electronic component, deposited over any sort of substrate such as a Si wafer.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetoresistive sensor, comprising;
   providing a substrate;
   depositing a plurality of sensor layers onto the substrate, the sensor layers having a surface;
   forming a mask structure over the sensor layers;
   performing a first ion mill, the first ion mill being performed at a bias voltage of 200-400 V; and
   performing a second ion mill at a glancing angle with respect to a normal to the surface of the sensor layers, the second ion mill being performed at a second bias voltage that is equal to or lower than the first bias.

2. A method as in claim 1 wherein the substrate comprises an electrically conductive material.

3. A method as in claim 1 wherein the substrate comprises an electrically conductive, magnetic material.

4. A method as in claim 1 wherein the substrate comprises an electrically conductive magnetic material and the sensor is a current perpendicular to plane (CPP) sensor.

5. A method as in claim 1 wherein the first ion mill is performed sufficiently to remove the sensor material down to the level of the substrate.

6. A method as in claim 1 wherein the first ion mill is performed sufficiently to remove a portion of the sensor material, but is terminated before reaching the substrate.

7. A method as in claim 1 wherein:
   the first ion mill is performed for a first duration;
   the second ion mill is performed for a second duration; and
   the second duration is 100%-200% the first duration.

8. A method as in claim 1 wherein the first and second ion mill are performed while the substrate and sensor layers are held on a chuck, and wherein the first and second ion mill are performed while rotating the chuck.

9. A method as in claim 1 wherein mask structure has no undercut.

10. A method as in claim 1 wherein the mask structure is a single layer mask structure.

11. A method for manufacturing a magnetoresistive sensor, comprising:
    providing a substrate;
    depositing a plurality of sensor layers onto the substrate, the sensor layers having a surface;
    forming a mask structure over the sensor layers;
    performing a first ion mill at an angle of 0-30 degrees with respect to a normal to the surface of the sensor layers, the first ion mill being performed with a first bias voltage; and
    performing a second ion mill at an angle of 50-89 degrees with respect to a normal to the surface of the sensor layers, the second ion mill being performed at a second bias voltage that is equal to or lower than the first bias voltage;
    wherein the first bias voltage is 200-400 volts.

12. A method as in claim 11 wherein the first and second ion mill are performed while the substrate and sensor layers are held on a chuck, and wherein the first and second ion mill are performed while rotating the chuck.

13. A method as in claim 11 wherein mask structure has no undercut.

14. A method as in claim 11 wherein the mask structure is a single layer mask structure.

15. A method as in claim 11 wherein:
the first ion mill is performed for a first duration;
the second ion mill is performed for a second duration; and
the second duration is 100%-200% the first duration.

16. A method of manufacturing an electronic component, comprising:
providing a substrate;
depositing one or more component layers onto the substrate, the component layers having a surface;
forming a mask structure over the component layers;
performing a first ion mill, the first ion mill being performed with a first bias voltage; and
performing a second ion mill at a glancing angle with respect to a normal to the surface of the component layers, the second ion mill being performed at a second bias voltage that is lower than the first bias voltage.

17. A method for manufacturing a magnetoresistive sensor, comprising;
providing a substrate;
depositing a plurality of sensor layers onto the substrate, the sensor layers having a surface;
forming a mask structure over the sensor layers;
performing a first ion mill, the first ion mill being performed with a first bias voltage; and
performing a second ion mill at a glancing angle with respect to a normal to the surface of the sensor layers, the second ion mill being performed at a second bias voltage that is equal to or lower than the first bias voltage;
wherein the forming a mask structure comprises:
depositing an image transfer layer;
depositing a photoresist layer;
photolithographically patterning the photoresist to form a photoresist mask; and
performing a reactive ion etch (RIE) to transfer an image of the photoresist mask onto the image transfer layer.

18. A method for manufacturing a magnetoresistive sensor, comprising;
providing a substrate;
depositing a plurality of sensor layers onto the substrate, the sensor layers having a surface;
forming a mask structure over the sensor layers;
performing a first ion mill, the first ion mill being performed with a first bias voltage; and
performing a second ion mill at a glancing angle with respect to a normal to the surface of the sensor layers, the second ion mill being performed at a bias voltage of 100-200 V, the first ion mill being performed at a bias voltage that is greater than or equal to the second bias voltage.

19. A method for manufacturing a magnetoresistive sensor, comprising;
providing a substrate;
depositing a plurality of sensor layers onto the substrate, the sensor layers having a surface;
forming a mask structure over the sensor layers;
performing a first ion mill, the first ion mill being performed at a bias voltage of 200-400 V; and
performing a second ion mill at a glancing angle with respect to a normal to the surface of the sensor layers, the second ion mill being performed at a bias voltage that is 100-200 V.

20. A method for manufacturing a magnetoresistive sensor, comprising:
providing a substrate;
depositing a plurality of sensor layers onto the substrate, the sensor layers having a surface;
forming a mask structure over the sensor layers;
performing a first ion mill at an angle of 0-30 degrees with respect to a normal to the surface of the sensor layers, the first ion mill being performed with a first bias voltage; and
performing a second ion mill at an angle of 50-89 degrees with respect to a normal to the surface of the sensor layers, the second ion mill being performed at a second bias voltage that is equal to or lower than the first bias voltage;
wherein the second bias voltage is 100-200 volts.

21. A method for manufacturing a magnetoresistive sensor, comprising:
providing a substrate;
depositing a plurality of sensor layers onto the substrate, the sensor layers having a surface;
forming a mask structure over the sensor layers;
performing a first ion mill at an angle of 0-30 degrees with respect to a normal to the surface of the sensor layers, the first ion mill being performed with a first bias voltage; and
performing a second ion mill at an angle of 50-89 degrees with respect to a normal to the surface of the sensor layers, the second ion mill being performed at a second bias voltage that is equal to or lower than the first bias voltage;
wherein the first bias voltage is 200-400 volts and the second bias voltage is 100-200 volts.

22. A method for manufacturing a magnetoresistive sensor, comprising:
providing a substrate;
depositing a plurality of sensor layers onto the substrate, the sensor layers having a surface;
forming a mask structure over the sensor layers;
performing a first ion mill at an angle of 0-30 degrees with respect to a normal to the surface of the sensor layers, the first ion mill being performed with a first bias voltage; and
performing a second ion mill at an angle of 50-89 degrees with respect to a normal to the surface of the sensor layers, the second ion mill being performed at a second bias voltage that is equal to or lower than the first bias voltage;
wherein the forming a mask structure comprises:
depositing an image transfer layer;
depositing a photoresist layer;
photolithographically patterning the photoresist to form a photoresist mask; and
performing a reactive ion etch (RIE) to transfer an image of the photoresist mask onto the image transfer layer.

23. A method for manufacturing a magnetoresistive sensor, comprising;
providing a substrate;
depositing a plurality of sensor layers onto the substrate, the sensor layers having a surface;
forming a mask structure over the sensor layers;
performing a first ion mill, the first ion mill being performed with a first bias voltage; and
performing a second ion mill at a glancing angle with respect to a normal to the surface of the sensor layers, the second ion mill being performed at a second bias voltage that is equal to or lower than the first bias voltage;

wherein the depositing a plurality of sensor layers further comprises:

depositing a magnetic pinned layer structure;

depositing a non-magnetic electrically insulating barrier layer; and depositing a magnetic free layer.

* * * * *